United States Patent
Ekbote et al.

(10) Patent No.: US 7,718,482 B2
(45) Date of Patent: May 18, 2010

(54) CD GATE BIAS REDUCTION AND DIFFERENTIAL N+ POLY DOPING FOR CMOS CIRCUITS

(75) Inventors: Shashank Ekbote, Allen, TX (US); Borna Obradovic, McKinney, TX (US); Greg C. Baldwin, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 137 days.

(21) Appl. No.: 11/928,872

(22) Filed: Oct. 30, 2007

(65) Prior Publication Data

US 2009/0098694 A1  Apr. 16, 2009

Related U.S. Application Data

(60) Provisional application No. 60/978,995, filed on Oct. 10, 2007.

(51) Int. Cl.
*H01L 21/8238* (2006.01)
(52) U.S. Cl. .............................. 438/200; 257/E21.632; 257/E21.661
(58) Field of Classification Search ................ 438/200, 438/197, 230, 231, 232, 286; 257/E21.632, 257/E21.661
See application file for complete search history.

(56) References Cited

U.S. PATENT DOCUMENTS

| | | | | |
|---|---|---|---|---|
| 7,164,596 B1* | 1/2007 | Deng et al. | ................. | 365/154 |
| 2002/0074597 A1* | 6/2002 | Ahmad et al. | ............... | 257/344 |
| 2006/0057811 A1* | 3/2006 | Chou et al. | ................. | 438/305 |

* cited by examiner

*Primary Examiner*—Walter L Lindsay, Jr.
(74) *Attorney, Agent, or Firm*—Jacqueline J. Garner; Wade J. Brady, III; Frederick J. Telecky, Jr.

(57) ABSTRACT

A method of fabricating a CMOS integrated circuit includes the steps of providing a substrate having a semiconductor surface, forming a gate dielectric layer on the semiconductor surface and a polysilicon layer on the gate dielectric layer. The polysilicon layer is patterned while being undoped to form a plurality of polysilicon comprising gates. A first pattern is used to protect a plurality of PMOS devices and a first n-type implant is performed to dope the gates and source/drain regions for a plurality of NMOS devices. A second pattern is used to protect the PMOS devices and the sources/drains and gates for a portion of the plurality of NMOS devices and a second n-type implant is performed to dope the gates of the other NMOS devices.

15 Claims, 2 Drawing Sheets

US 7,718,482 B2

CD GATE BIAS REDUCTION AND DIFFERENTIAL N+ POLY DOPING FOR CMOS CIRCUITS

CROSS-REFERENCE TO RELATED APPLICATIONS

This application claims the benefit of Provisional Application No. 60/978,995 entitled "CD GATE BIAS REDUCTION AND DIFFERENTIAL N+ POLY DOPING FOR CMOS CIRCUITS" filed on Oct. 10, 2007, which is hereby incorporated by reference in its entirety into the present application.

FIELD OF INVENTION

The present invention relates generally to semiconductor processing, and more particularly to CMOS processing flows and circuits therefrom which provide CD gate bias reduction and doping differentials to improve circuit performance.

BACKGROUND

Traditionally an n+ polysilicon pre-gate etch doping mask has been used to raise the dopant level in the polysilicon above the dopant level provided by the source/drain implant to improve NMOS transistor performance. In such a flow, following polysilicon deposition, an n+ poly pre-gate etch doping mask is used for protecting/covering the poly regions corresponding to the PMOS area, and an n-type dopant (e.g. P or As) is implanted into the polysilicon gates corresponding to the NMOS area. A dopant anneal may or may not follow the n-type poly pre-gate doping. A gate etch step then follows to define the n-doped polysilicon gates for the NMOS and undoped polysilicon gates for the PMOS. The pre-gate etch implant can result in creation of an unintended CD differential between PMOS (undoped poly) and NMOS (heavily doped poly) due to resulting poly etch rate differences.

As known in the art, TOXINV, which may also be referred to as inversion TOX, refers to the loss of inversion charge and therefore transconductance due to inversion-layer quantization and polysilicon-gate depletion effects. Quantum mechanic considerations dictate that the density of inversion electrons peaks at approximately 1 nm below the polysilicon surface, which effectively reduces the gate capacitance and therefore the inversion charge in the case of an oxide dielectric to those of an equivalent oxide dielectric about 0.4 nm thicker than the physical gate dielectric (e.g. oxide). Similarly, depletion effects occur in polysilicon in the form of a thin space-charge layer near the dielectric interface which acts to reduce the gate capacitance and inversion-charge density for a given gate drive condition. The percentage of gate-capacitance attenuation is known to become more significant as the dielectric thickness is reduced. For example, for a polysilicon doping level of $10^{20}$ cm$^{-3}$, a 2-nm oxide dielectric loses about 20% of the inversion charge at 1.5-V gate voltage because of the combined effects of polysilicon gate depletion and inversion-layer quantization. Using n-type dopant in n-type polysilicon for NMOS transistors above levels provided by source/drain implantation is known to provide a reduced TOXINV, which in turn can improve NMOS performance.

CMOS logic gates used in a wide variety of CMOS circuits are all generally based on the static inverter. FIG. 1 a schematic of a conventional static CMOS inverter circuit 10. Both transistors in the inverter circuit 10 are generally enhancement-mode MOSFETs; NMOS 12 with its source grounded, and PMOS 11 with its source connected to Vdd. Their respective gates are connected together to form the input, shown as A, generally coupled together using a polysilicon line 15, and their drains are connected together to form the output, shown as Q. During their respective source/drain implants, the gate electrode of the PMOS 11 is doped p+, while the gate of the NMOS 12 is doped n+. A silicide or other shunting layer is generally used to short the n+/p+ diode formed by the polysilicon line 15 coupling the gates of PMOS 11 and NMOS 12.

As known in the art, the inverter circuit 10 is used in logic gates other than the inverter, such as for NOR and NAND circuits, by combining inverter circuits in a partially series or partially parallel structure, and in other circuits such as certain latches. Regarding latches, for example, a master-slave D flip-flop includes a CMOS inverter to invert the enable input applied to the master for application to the slave.

Moreover, certain high density circuits having a large number transistors from complex microprocessor integrated circuits to signal processing and communication circuits generally include CMOS inverters. For example, the Arithmetic and Logic Unit (ALU) for a Microprocessor generally includes CMOS logic gates, including a plurality of CMOS inverters.

Another example of an integrated circuit that includes CMOS inverters is a static ram (SRAM), which generally uses a pair of cross coupled inverters in the bit cells. For example, for integrated circuits that include conventional 5T or 6T SRAM cells, the p+ poly gates of the PMOS load (pull-up) and the n+ poly gates of the NMOS driver (pull-down) are coupled by an n+ polysilicon line. Silicide or another conductor is generally used to short the n+/p+ diode formed.

Yet another example of an integrated circuit that uses CMOS inverters is a dynamic RAM (DRAM). The sense amplifier in a DRAM is typically essentially a pair of cross-connected inverters between the bit lines. That is, the first inverter is connected from the + bit line to the − bit line, and the second is connected from the − bit line to the + bit line.

In certain circuits n+ poly doping can result in counterdoping the p+ doped PMOS gate. For example, as described above, in SRAM cells, the inverters in the memory cell generally have their poly gates coupled using a polysilicon line. With the polysilicon coupling lines n+ doped by the pre-gate etch n-type implant generally provided on SRAMs, the PMOS load transistor can experience significant and locally variable gain boundary cross-diffusion from the n+ dopant from conventional activation/annealing processes, particularly when phosphorous is used as the n-type dopant. As a result, the PMOS load transistors can suffer a significant increase in TOXINV which can be locally variable, with a resulting degradation in PMOS performance, such as by degrading VTLIN/VTSAT control, increasing VTLIN/VTSAT variability, and degrading IDSAT device performance. Local VTLIN variation (VT mismatch) in adjacent bit cell transistors can also become a problem, leading to degraded cell stability.

Scaling can exacerbate this counter doping problem. When design rules shrink, the n-poly mask edge to the n-well boundary spacing shrinks. If n+ poly mask/implants are used in SRAM bit cell NMOS transistors to improve NMOS performance, the PMOS load (pull-up) transistor will increasingly get n-type dopant counter-doping its polysilicon gate, degrading the PMOS transistors in the memory cell.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A method of fabricating a CMOS integrated circuit includes the steps of providing a substrate having a semiconductor surface, forming a gate dielectric layer on the semiconductor surface, and a polysilicon layer on the gate dielectric layer. The polysilicon is patterned while being undoped to form a plurality of polysilicon comprising gates. As used herein, "undoped" polysilicon refers to a polysilicon doping level $<10^{17}$ cm$^{-3}$, generally being $<10^{15}$ cm$^{-3}$. A first pattern is used to protect a plurality of PMOS devices and a first n-type implant is performed to dope the gates and source/drain regions for a plurality of NMOS devices. A second pattern is used to protect the plurality of PMOS devices and the sources/drains and gates for a portion of the NMOS devices and a second n-type implant is performed to dope the gates of the other NMOS devices. The second pattern can also protect sources/drains for the other NMOS devices. The patterning step can define a plurality of polysilicon lines, some of the polysilicon lines coupling gates of a PMOS device to a gates of an NMOS device, wherein the second pattern blocks the second n-type implant from the polysilicon lines coupling gates of the PMOS device to the gate of the NMOS device.

In one embodiment the dopant for the first n-type implanting comprises at least one of phosphorous and arsenic. For example, the first n-type implanting can comprise a phosphorous dose between $5\times10^{14}$ and $5\times10^{15}$ cm$^{-2}$ at an energy between 2 and 8 KeV or an arsenic dose between $5\times10^{14}$ and $5\times10^{15}$ cm$^{-2}$ at an energy between 20 and 40 KeV (energy generally a function of poly thickness).

In one embodiment of the invention the dopant for the second n-type implanting can comprise phosphorous. The second n-type implanting can comprise a phosphorous dose between $2\times10^{15}$ and $5\times10^{15}$ cm$^{-2}$ at an energy between 2 and 8 KeV.

In embodiments of the invention the polysilicon gates which receive the second n-type implant can have at least a 20% higher n-type dose as compared to the polysilicon gates which do not receive the second n-type implant. The higher dose can comprise at least 30% higher, such as at least 40% or at least 50% higher.

In one embodiment the patterning step defines a plurality of polysilicon lines, and the CMOS integrated circuit comprises an SRAM having a plurality of memory cells formed in the masked portion, wherein the memory cells comprise cross coupled inverters having PMOS loads and NMOS drivers coupled by one of the polysilicon lines. In one embodiment the SRAM comprises a differential 6T SRAM.

A method of fabricating a CMOS integrated circuit comprises the steps of providing a substrate having a semiconductor surface, forming a gate dielectric layer on the semiconductor surface and a polysilicon layer on the gate dielectric layer. The polysilicon layer is patterned while being undoped to form a plurality of polysilicon comprising gates. A first pattern is provided to protect a plurality of PMOS devices and first n-type implanting is performed to dope the gates and source/drain regions for a plurality of NMOS devices. A second pattern is provided to protect the PMOS devices and the sources/drains and gates for a portion of the NMOS devices, and sources/drains for others of the NMOS devices, and a second n-type implanting is performed to dope the gates of the others of the NMOS devices. The fabrication of the integrated circuit is then completed.

DETAILED DESCRIPTION

Figure 1:
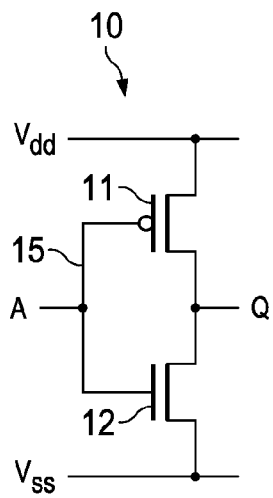
FIG. 1 is a schematic of a conventional static CMOS inverter circuit.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts can occur in different orders and/or concurrently with other acts or events. Furthermore, not all illustrated acts or events are required to implement a methodology in accordance with the present invention.

Embodiments of the invention etch the polysilicon before n-type doping the polysilicon by skipping the pre-gate etch n+ poly pattern/implant/anneal step which would otherwise occur in certain process flows before the gate poly etch. The invention is broadly applicable to CMOS integrated circuits, particularly those that include polysilicon lines connecting polysilicon comprising gates of NMOS and PMOS transistors, such as in circuits that include conventional CMOS inverters and other inverter comprising logic gates.

By etching the poly before n+ poly doping overcomes the CD delta problem between PMOS and NMOS. Embodiments of the invention perform n+ poly doping in addition to the dopant received at n+ S/D implant after the spacer process using the n+ poly pattern, and in one embodiment, masks the NMOS S/D regions during the n+ poly doping step, as well as masks certain circuit regions that include one or more NMOS transistors (e.g. circuit regions comprising CMOS inverters).

Figure 2:
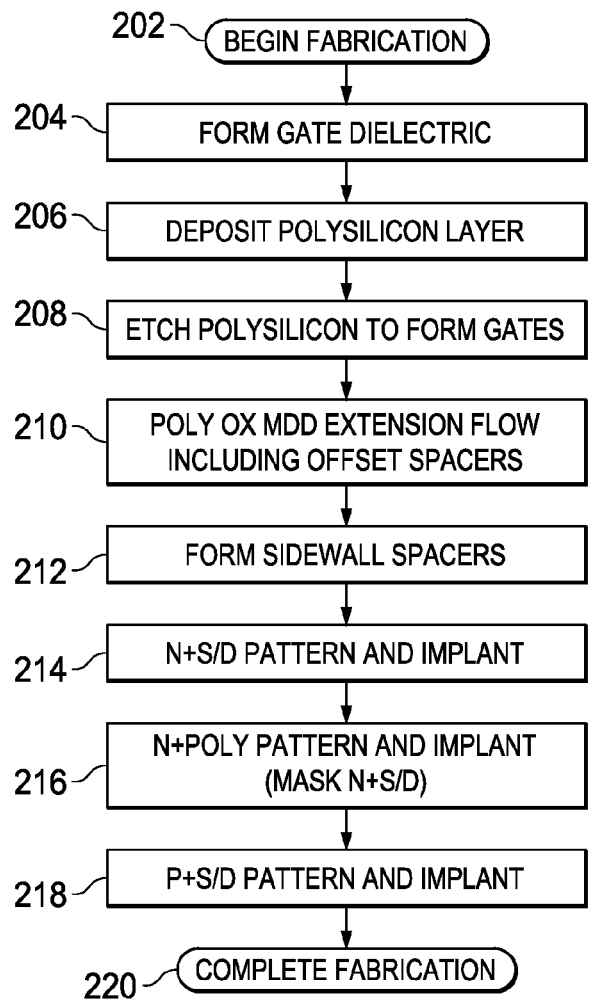
FIG. 2 is a flow diagram illustrating a method of fabricating a CMOS semiconductor device having a differential polysilicon doping flow, according to an embodiment of the invention.

FIG. 2 is a flow diagram illustrating a method of fabricating a CMOS semiconductor device, according to an embodiment of the invention. In step 202, fabrication begins and includes the step of providing a substrate having a semiconductor surface, and generally includes the steps of well formation and isolation processing. Substrates can be semiconducting or dielectric, or variants such as semiconductor on insulator (SOI). A gate dielectric layer (e.g. silicon dioxide, oxynitride or a high-k dielectric) is formed in step 204, such as grown or deposited, on the semiconductor surface. In step 206 a polysilicon layer is deposited on the gate dielectric layer. Unlike certain flows which add an n+ pre-gate etch poly implant, this embodiment of the invention skips the pre-gate etch n+ poly implant processing. In step 208, the polysilicon layer is then patterned to form a plurality of polysilicon gates and generally also a plurality of polysilicon lines. In step 210 a conventional source-drain extension flow is used, such comprising a thin offset layer (e.g., a silicon dioxide or silicon nitride layer) formed generally conformally over the patterned polysilicon gate and then etched using a generally anisotropic dry etch to leaving a thin offset spacer material on lateral edges of the gates. An extension region implant is then performed to form extension regions. For example, lightly doped, medium doped or heavily doped extension region implants are performed in the NMOS and PMOS regions, respectively. A thermal process such as a rapid thermal anneal can then be employed to activate the extension region dopants, which causes the extension regions to diffuse laterally slightly underneath the offset spacer toward the channels.

Sidewall spacers in step 212 are then formed on the gate structures. The sidewall spacers are substantially thicker than the offset spacers, thereby resulting in the subsequently formed source/drain regions to be offset from lateral edges of the gate.

Step 214 comprises patterning and an n+ S/D implant. This implant goes into the poly designed to be n+ poly as well as well as the silicon S/D region of the NMOS and the contacts (e.g. well or substrate) for the PMOS. In one embodiment the dopant for the implant at step 214 comprises at least one of phosphorous and arsenic. For example, this implant can comprise a phosphorous dose between $5\times10^{14}$ and $5\times10^{15}$ cm$^{-2}$ at an energy between 2 and 8 KeV or an arsenic dose between $5\times10^{14}$ and $5\times10^{15}$ cm$^{-2}$ at an energy between 20 and 40 KeV (energy generally a function of poly thickness).

Step 216 comprises applying a pattern (e.g. photoresist) which opens the n-poly region, but not the silicon NMOS S/D region. Misalignment is generally not a problem because the sidewall spacer acts as a mask to prevent the implant at step 216 from entering the S/D region. In one embodiment, a portion of the NMOS transistors are masked so that the n-poly implant at step 216 is prevented from entering the n+ poly gates in certain selected circuit portions, such as in the memory cell regions (arrays) in the case of an SRAM, referred to herein as a selective n+ poly implant. In one embodiment of the invention, the dopant for the selective n+ poly implant can comprise phosphorous, using a dose between $2\times10^{15}$ and $5\times10^{15}$ cm$^{-2}$ at an energy between 2 and 8 KeV (energy generally a function of poly thickness).

In this embodiment, upon completing fabrication of the integrated circuit, the integrated circuit comprises at least one first region formed in the masked portion during the n+ poly implant (and thus lacks the additional n+ poly implant dose) and at least one second region formed in the unmasked region during step 216 which receives the additional n+ poly implant dose. As a result, the total n-type dose in certain n-type polysilicon regions being the combination of the selective n+ poly implant and n+ S/D dose is generally at least 20% higher as compared to the total dose in the regions masked during the n+ poly implant which receive only the n+ S/D dose. In certain embodiments, the difference can be 25% higher, 30%, 40%, 50%, or more than 50% higher. Doping level differences can be determined using several methods, including scanning capacitive microscopy.

Following removal of the masking material and a clean, a p+ pattern and p+ S/D implant is performed at step 218. Although not shown in FIG. 2, steps 216 and 218 can be reversed to perform the p+ S/D implant before the n+ poly implant. Fabrication is completed at step 220, such as including the steps of silicidation (e.g. CoSi$_2$ or NiSi) of the S/D region and poly silicon gate, then forming electrically conductive contacts through a pre-metal dielectric (PMD) layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material.

Figure 3:
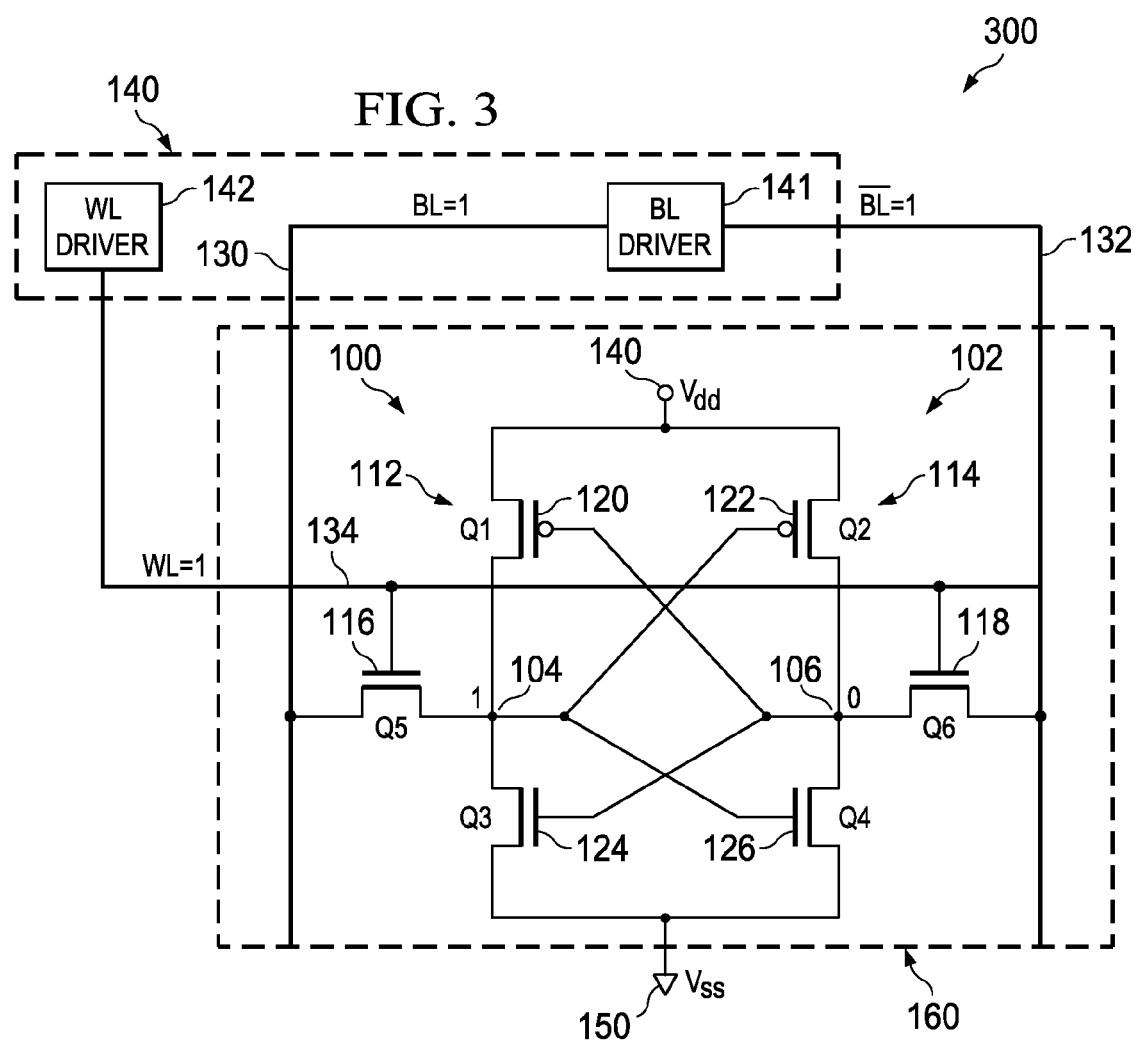
FIG. 3 a schematic diagram of an integrated circuit including differential n+ polysilicon doping comprising a differential 6T static random access memory (SRAM) cell and WL and BL drivers, according to an embodiment of the invention.

In one specific embodiment of the invention, the integrated circuit comprises an SRAM. FIG. 3 is schematic of an integrated circuit 300 including a differential SRAM 6T cell 100 formed in a region of the circuit 160. The total n+ dose in n-type polysilicon in the non-memory region 140 is at least 20% higher, such as 30 to 50% higher, as compared to the total dose in n-type polysilicon in memory cell region 160. The non-memory region typically handles interfacing with external devices (data in and out of the chip), power management, voltage regulation, and the like. The memory cell region 160 comprises CMOS transistor devices, including NMOS and PMOS transistor devices, which generally operate at relatively lower power as compared to CMOS transistor devices outside the non-memory region 140.

Non-memory region 140 is shown including BL driver 141 and WL driver 142 where the higher n+ dose in n-type polysilicon can be used. Bit cells 100 as illustrated, comprises a data storage cell or latch 102, generally including a pair of cross-coupled inverters, for example, inverter 112, and inverter 114, the latch 102 operable to store a data bit state. FIG. 3 illustrates that the bit is stored in the latch 102 at the data nodes or first and second latch nodes 104 and 106, respectively, having a high or "1" state and a low or "0" state, respectively. Cell 100 also comprises a pair of wordline pass transistors 116, 118 to read and write the data bit between the cross-coupled inverters 112, 114 and bit lines BL 130, BL-bar 132, when enabled by wordline 134.

Respective inverters 112, 114 comprise a p-type MOS (PMOS) pull-up or load transistor Q1 120, Q2 122 and an n-type (NMOS) pull-down transistor Q3 124, Q4 126. Pass gates (e.g., transistors) Q5 116, Q6 118 are n-channel as well, which generally supply higher conductance as compared to p-channel transistors. Pass transistors 116, 118 are enabled by wordline 134 and accessed by bit lines 130, 132 to set or reset the SRAM latch 100. Inverters 112, 114 of the SRAM memory cell 100 are connected together to a Vdd drain power supply line 140 and a Vss source power supply line 150.

In general, SRAM cells are more stable and have better data retention where the respective PMOS (120, 122) and NMOS (124, 126) transistors are balanced and matched within the two inverters (112, 114). However, as dimensions are reduced to scale down devices, as noted above, in structures such as inverters that use poly coupling PMOS gates to NMOS gates, dopant in n+ poly (particularly in the case of phosphorous) can diffuse to counterdope p+ doping in the p+ poly gates. The counterdoping can vary significantly, even locally, such as within a bit cell mainly due to grain boundary diffusion effects. In the 6T cell shown, for example, counterdoping can cause imbalance in the PMOS load transistors, leading to degraded stability and may be unstable enough to not be able to retain the desired bit state, during either or both the read or write operations.

Applied to inverter comprising SRAMs, such as 5T or 6T SRAMs, through use of an appropriate mask, the pre-gate n+ poly implant can be blocked for NMOS transistors in the SRAM cells, and allowed to reach the polysilicon outside the SRAM cell region (e.g. controller or driver and logic region). Modification in the n-poly pattern for these embodiments of the invention can be such that whenever SRAM layer is drawn, the n-poly implant is blocked from that region. Blocking n-poly implants in NMOS transistors whenever they are in the SRAM bit cell allows keeping n+ poly implants in non-memory NMOS transistors thereby utilizing its potential of improving NMOS transistor performance through reduction of inversion TOX. Keeping the pre-gate n+ poly implant out of the bit cell region eliminates or at least reduces induced cross diffusion problems for p-type (load/pull-up) transistor in SRAM bit cell. Thus, embodiments of the invention can provide a yield and performance enhancement without degrading non-memory (e.g. logic) NMOS transistor performance.

Embodiments of the invention also allow scaling of source/drain sidewall in the region receiving the pre-gate etch poly implant, since the NMOS transistors do not have to solely rely on N-type doping coming from n+ S/D implants. For circuitry having NMOS and PMOS gates coupled by polysilicon, such as the memory cell area of conventional SRAMs, design rules (such as spacing of n-poly mask edge to n-well boundary) can be made tighter to enable shrinks for improved density.

Although the invention has generally been described relative to SRAMs, as noted above, the invention is not limited to SRAMs since the invention is generally applicable to any CMOS circuit that has NMOS and PMOS gates, such as those having NMOS and PMOS gates coupled by polysilicon. For example, the invention is generally applicable to a wide variety of CMOS circuits including microprocessors, signal processing, communication circuits and memory comprising circuits other than SRAM, such as DRAM.

The invention is also not limited to the use of silicon wafers, and may be implemented in association with the manufacture of various semiconductor devices, SRAM memory devices, or other such devices, wherein the design and optimization of an SRAM cell is an issue, where cell access is to be limited only to the memory area being used, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating a CMOS integrated circuit, comprising:

providing a substrate having a semiconductor surface;

forming a gate dielectric layer on said semiconductor surface and a polysilicon layer on said gate dielectric layer;

patterning said polysilicon to form a plurality of polysilicon comprising gates, wherein said polysilicon layer is patterned while being undoped;

providing a first pattern to protect a plurality of PMOS devices and first n-type implanting to dope said gates and source/drain regions for a plurality of NMOS devices;

providing a second pattern to protect said PMOS devices and said sources/drains and said gates for a first portion of said NMOS devices while exposing said gates of a second portion of said NMOS devices, second n-type implanting to dope said gates of said second portion of said NMOS devices using said second pattern, and completing fabrication of said integrated circuit.

2. The method of claim 1, wherein said second pattern also protects sources/drains for said second portion of said NMOS devices.

3. The method of claim 1, wherein said patterning step defines a plurality of polysilicon lines, some of said polysilicon lines coupling gates of a PMOS device to a gates of an NMOS device, wherein said second pattern blocks said second n-type implant from said polysilicon lines coupling gates of said PMOS device to said gate of said NMOS device.

4. The method of claim 1, wherein dopant for said first n-type implanting comprises at least one of phosphorous and arsenic.

5. The method of claim 4, wherein a dose for said first n-type implanting comprises a phosphorous dose between $5 \times 10^{14}$ and $5 \times 10^{15}$ cm$^{-2}$ at an energy between 2 and 8 KeV or an arsenic dose between $5 \times 10^{14}$ and $5 \times 10^{15}$ cm$^{-2}$ at an energy between 20 and 40 KeV.

6. The method of claim 1, wherein dopant for said second n-type implanting comprises a phosphorous dose between $2 \times 10^{15}$ and $5 \times 10^{15}$ cm$^{-2}$ at an energy between 2 and 8 KeV.

7. The method of claim 1, wherein said polysilicon gates which receive said second n-type implant have at least a 20% higher n-type dose as compared to said polysilicon gates which do not receive said second n-type implant.

8. The method of claim 7, wherein said higher dose comprises at least 30% higher.

9. The method of claim 1, wherein said patterning step defines a plurality of polysilicon lines, and wherein said CMOS integrated circuit comprises an SRAM having a plurality of memory cells formed in said masked portion, said memory cells comprising cross coupled inverters having PMOS loads and NMOS drivers coupled by one of said polysilicon lines.

10. The method of claim 9, wherein said SRAM comprises a differential 6T SRAM.

11. A method of fabricating a CMOS integrated circuit, comprising the steps of:

providing a substrate having a semiconductor surface;

forming a gate dielectric layer on said semiconductor surface and a polysilicon layer on said gate dielectric layer;

patterning said polysilicon layer, wherein said polysilicon layer is patterned while being undoped to form a plurality of polysilicon comprising gates;

providing a first pattern to protect a plurality of PMOS devices;

first n-type implanting to dope said gates and source/drain regions for a plurality of NMOS devices;

providing a second pattern to protect said PMOS devices and said sources/drains and said gates for a portion of said NMOS devices, and sources/drains for a second portion of said NMOS devices, second n-type implanting to dope said gates of said second portion of said NMOS devices using said second pattern, and completing fabrication of said integrated circuit.

12. The method of claim 11, wherein said patterning step defines a plurality of polysilicon lines, some of said polysilicon lines coupling gates of a PMOS device to a gates of an NMOS device, wherein said second pattern blocks said second n-type implant from said polysilicon lines coupling gates of said PMOS device to said gate of said NMOS device.

13. The method of claim 11, wherein said patterning step defines a plurality of polysilicon lines, and wherein said CMOS integrated circuit comprises an SRAM having a plurality of memory cells formed in said masked portion, said memory cells comprising cross coupled inverters having PMOS loads and NMOS drivers coupled by one of said polysilicon lines.

14. The method of claim 13, wherein said SRAM comprises a differential 6T SRAM.

15. The method of claim 11, wherein said polysilicon gates which receive said second n-type implant have at least a 20% higher n-type dose as compared to said polysilicon gates which do not receive said second n-type implant.

* * * * *